United States Patent [19]
Constant

[11] 3,971,993
[45] July 27, 1976

[54] HIGH CAPACITY RECIRCULATING DELAY LOOP INTEGRATOR

[76] Inventor: James N. Constant, 1603 Danbury Drive, Claremont, Calif. 95612

[22] Filed: Apr. 21, 1972

[21] Appl. No.: 246,299

[52] U.S. Cl.............................. 328/127; 328/144; 330/149
[51] Int. Cl.²......................................... H03B 1/04
[58] Field of Search ........... 328/127, 128, 164, 179, 328/162; 235/183; 307/229; 330/149

[56] References Cited
UNITED STATES PATENTS

| | | |
|---|---|---|
| 2,736,021 | 2/1956 | Sunstien............................. 328/127 |
| 2,841,704 | 7/1958 | Sanstien et al..................... 328/127 |
| 3,092,778 | 6/1963 | Siomko........................... 328/127 X |
| 3,201,705 | 8/1965 | Hanulec et al.................. 328/127 X |
| 3,471,798 | 10/1969 | Seidel ................................ 330/149 |
| 3,541,467 | 11/1970 | Seidel ............................ 330/149 X |
| 3,649,927 | 3/1972 | Seidel ................................ 330/149 |

Primary Examiner—John S. Heyman
Assistant Examiner—B.P. Davis
Attorney, Agent, or Firm—Harris, Kern, Wallen & Tinsley

[57] ABSTRACT

A system for integrating recurring pulses. A pulse compression system. A delay network for recirculating the input pulses. The system output is a pulse which substantially equals the sum of input pulses.

6 Claims, 2 Drawing Figures

HIGH CAPACITY RECIRCULATING DELAY LOOP INTEGRATOR

This invention relates to signal integrating systems or pulse compression systems and more particularly to systems for integrating periodically recurring pulse trains or to systems for integrating or compressing long frequency or phase modulated pulses in a recirculating delay loop integrator.

In many instances it is desired to integrate a series of pulses which recur periodically or to compress single long pulses. Typical examples are in the fields of radar, sonar, communications, data processing, etc. In general, superimposed on the signals are noise signals resulting from the combined effects of ground or sea clutter, or chaff, and noise signals generated within receivers, etc. These noise signals make it difficult to detect small targets, for example a submarine snorkel using radar, or even large targets, for example a submarine using sonar, under normal operating conditions by the use of non-integrating signal systems. Furthermore it often happens that space, weight, power consumption, and cost allocations, as well as integrating performance requirements, restrict the use of conventional signal integrating systems. Therefore, a suitable signal integration system must be provided to obtain cost-effective solutions to these problems. The system of the present invention permits the integration of a large number of recurring pulses or the compression of long modulated pulses at high compression ratios and with the least size, weight, power consumption, and cost of equipment. Integrator circuits have been developed for improving the signal-to-noise and signal-to-clutter ratio of radar and sonar systems. Furthermore such circuits have been developed to recirculate the output and thereby to conserve system size, weight, power consumption, and cost. Basically a recirculating integrator or pulse compressor consists of a memory, such as an ultrasonic delay line, with a controlled feedback circuit coupling the output of the memory circuit to the input thereof to form a recirculating signal loop. The delay line of the memory circuit is chosen equal to the pulse repetition period. If the pulses are frequency modulated, for example having linear FM over a number of pulses, a frequency shifter is included in the signal loop to synchronize pulses to a common frequency prior to their addition. Pulses are introduced into the recirculating signal loop where they are combined with previously introduced pulses. An output signal which is proportional in amplitude to a fraction of the sum of input pulses is derived from the recirculating loop.

To prevent unwanted oscillations or "ringing" due to positive feedback in a recirculating signal loop, the pulse must be attenuated by an amount k after each pass through the line. The factor k is the gain of the loop formed by the delay line and the feedback. It must be less than unity for stable operation. The number of pulses which may be integrated depends on the value of k. The optimum value of k however is given by:

$$k \cong e^{-1/n} \qquad (1)$$

where $n$ is the number of pulses integrated.

Conventional recirculating signal systems generally meet the requirement imposed by equation (1) for $n$ on the order of $10^3$, i.e., on the order of 1,000 pulses integrated. It is a well known fact that single loop recirculating delay line integrators are limited in practice to loop gains less than about 0.9. This corresponds to an optimum number of pulses integrated of about 10. Loop gains greater than this generally result in oscillations. Double loop configurations however have been developed which permit stable loop gains of the order of 0.98 – 0.99 or more, corresponding to about 50 – 100 pulses integrated. Such recirculating delay lines are based on amplitude modulated signals. Loop gains even closer to unity may be obtained with delay lines recirculating frequency modulated or phase modulated signals. Thus, conventional FM recirculating delay lines have stable loop gains on the order of 0.999 corresponding to 1,000 pulses integrated. To increase further the number of pulses integrated, the integration must be performed in the straightforward manner using conventional non-recirculating integrators, for example tapped delay lines, and consequently significantly increasing the size, weight, power consumption, and cost of the signal processing equipment. These shortcomings are usually overlooked where a larger number of pulses must be integrated and the integration can be obtained in no other way. Although the conventional recirculating signal integrating systems have the potential to integrate a large number of pulses, in practice they are limited and the integration can be accomplished only by using non-recirculating systems with the attendant increase in the system size, weight, power consumption, and cost.

The present invention is directed to a system which overcomes the problems and limitations in conventional recirculating signal integrating systems. In accordance with the present invention, the integration of pulses is accomplished with an optimum loop gain which is significantly higher than that which can be obtained using the present state of the art.

Utilizing the system of the present invention, the loop gain of a recirculating signal integrating system may approach unity to any degree of accuracy.

It is therefore an object of the present invention to provide a system for the optimum integration of pulses substantially without limit to the actual number of pulses.

Another objective of the present invention is to provide a system for the optimum compression of modulated pulses substantially without limit to the bandwidth-duration product of the pulse.

Another objective of this invention is to provide a stable recirculating signal system having a loop gain which approaches unity to any desired degree of accuracy.

Another objective of this invention is to provide a high capacity recirculating delay loop integrator having small size, weight, power consumption, and cost.

Other objects, advantages, features, and results will more fully appear in the course of the following description. The drawings merely show and the description merely describes a preferred embodiment of the present invention in a single loop configuration and is given by way of illustration or example.

Figure 1:
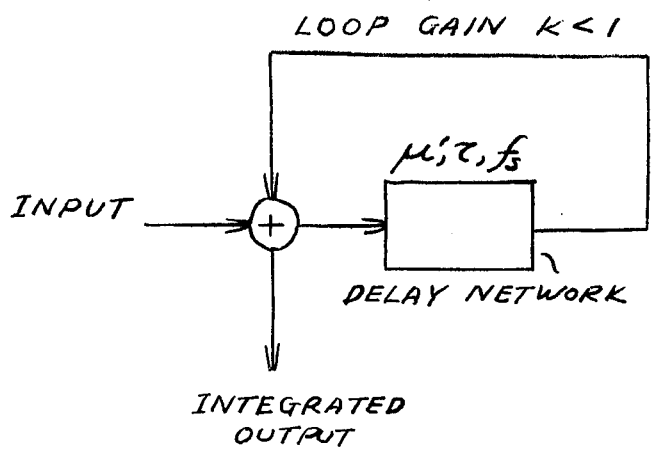
FIG. 1 is a block diagram of a high capacity recirculating delay loop integrator for integrating signals and incorporating the presently preferred embodiment of the invention.

In order to describe the system reference is made to FIG. 1. A delay network is used in a recirculating loop to recirculate pulses appearing at the input. The delay network is characterized as having gain k, time delay Z, and frequency shift $f_s$. The loop gain is always less than unity and is given by:

$$k = \mu\beta < 1 \qquad (2)$$

in which $\mu$ is the main amplifier gain of the delay network and $\beta$ is a constant of proportionality.

Consider a train of n pulses appearing at the input. The first pulse is stored for a period $(n-1)Z$, the second for a period $(n-2)Z$, and so forth. The pulses are added sequentially and produce the integrated output. The significant difference between the system of the present invention and conventional systems is with regard to the implementation of the delay network. Conventional systems implement their equivalents to the delay network as a simple delay line driven by an amplifier. These systems have no way of correcting for inadvertant imperfections in their delay networks (amplifiers, etc.) and consequently result in loop ringing for large numbers of pulses integrated. The system of the present invention overcomes these limitations of conventional systems by using a feedforward correction circuit in its delay network for correcting for errors introduced as a result of the imperfections.

Signal integrators in the form of recirculating delay line loops have been disclosed in U.S. Pat. Nos. to Sunstein 2,736,021, Sunstein 2,841,704, Siomko 3,092,778, and Hanulec et al. 3,201,705 and are discussed at page 446 in the book by Skolnik "Introduction to Radar Systems" McGraw-Hill 1962.

Figure 2:
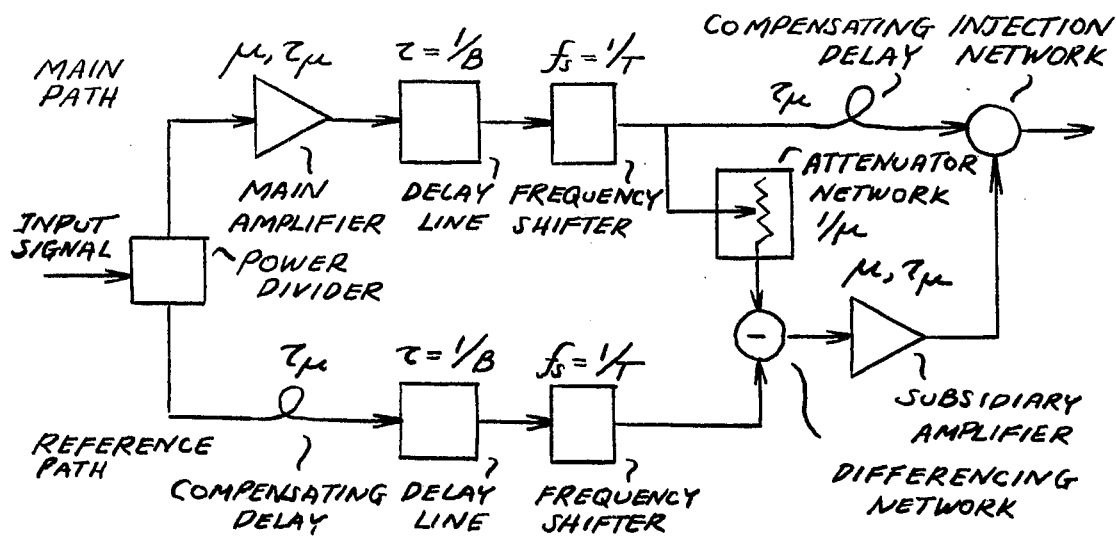
FIG. 2 is a block diagram of the Delay Network portion of the system shown in FIG. 1.

Referring to FIG. 2, the delay network in the system of the present invention may, for example, consist of replacing the amplifier-delay line system of the present recirculating delay loop art with a feedforward correction amplifier which has been modified to include time delay and frequency shift $f_s$ for providing the combined functions of error correction, time delay, and frequency shift in a recirculating delay loop integrator. The input signal is divided into two paths in a power divider; the main and reference paths. The main path goes through a main amplifier having gain $\mu$ and delay $Z\mu$, then is fed to a delay line having time delay $Z = 1/B$ where B is the signal bandwidth, and then on to a frequency shifter $f_s = 1/T$ where T is the signal duration, following which an attenuated portion of the signal, obtained in the attenuator having gain $1/\mu$, is compared with the reference path signal which has been delayed and frequency shifted in like manner. A compensating delay $Z\mu$ has been inserted in the reference path to compensate the main amplifier delay. The time-shifted error at the output of the differencing network is amplified in a subsidiary amplifier also having gain $\mu$ and delay $Z\mu$ and then injected into the main path through an injection network. A compensating delay $Z\mu$ has been inserted in the main path to compensate the subsidiary amplifier delay. The reamplified error at the output of the subsidiary amplifier is restored to the appropriate level to cancel the error of the main amplifier and its associated delay line. Because the gain in the subsidiary amplifier is just sufficient to balance the loss in the attenuation network, the imperfections in the main amplifier output are cancelled and do not appear in the final output. Since the subsidiary amplifier normally carries only a small signal, it need not be perfectly linear. As shown in the figure, the subsidiary amplifier has been made identical in gain and time delay with the main amplifier to furnish a valuable standby capability. Transmission through the circuit is correct even if the main amplifier fails. Of course, other settings for the main and subsidiary amplifiers are possible. Even though the circuit has closed loops balances in the two circuits prevent any feedback from circulating through either amplifier. The delay lines and frequency shifters are identical in both paths. The frequency shifters are omitted in applications having unmodulated signals in the form of recurring pulses. For this case time delays Z are set at the interpulse interval.

The power divider can be any one of any number of types such as a resistor, coupler, balanced bridge, etc. The main and subsidiary amplifiers can be any one of any number of types such as single or multistage, high gain, including bandlimiting filters, etc. The delay lines can be any one of any number of types such as acoustic lines, surface wave lines, digital systems, lumped parameter delay lines, electrostatic storage tubes, magnetic drums or discs, etc. The frequency shifters can be any one of any number of types such as fixed frequency local oscillators, phase shifters, ferrites, crystal diodes, etc. The attenuation network can be any one of any number of types such as a resistor, coupler, balanced bridge, etc. The differencing and injection networks can be any one of any number of types such as three winding transformers, Wheatstone bridges, error detectors, differencing circuits, transformers, couplers, etc. All above components are not objects of this invention but are subject to the constraints of the present invention.

The system just described in FIG. 2 is a conventional feedforward correction circuit in which identical time delays and frequency shifters have been included in the main and reference signal paths. The feedforward correction amplifier has been disclosed in U.S. Pat. Nos. to Seidel 3,471,798, Seidel 3,541,467, and Seidel 3,649,927, and is discussed in the article by R. K. Jurgen in IEEE Spectrum Apr., 1972 Conventional delay lines and frequency shifters are discussed in connection with the foregoing references by Sunstein, Siomko, Hanulec, Skolnik, and also in connection with the article by Byram et al. "Signal Processing Device Technology" Naval Undersea R&D Center, San Diego, CA 92132.

The delay network of FIG. 2 is almost identical to a Seidel feedforward correction amplifier, the difference being the provision to provide time delay and frequency shift functions in addition to the Seidel error correction function. Other configurations for the delay network are obviously possible, for example, utilizing delay lines and frequency shifters in combination with or as modifications to the variety of feedforward correction amplifiers disclosed by Seidel. Thus while FIG. 2 is a modification of Seidel's circuit, the straightforward combination of a Seidel feedforward correction amplifier driving a delay line and frequency shifter may also be provided, the exact configuration for the delay network being determined by the application.

From equation (1) the number of pulses which may be integrated in a recirculating delay loop integrator is given approximately by:

$$n \cong 1/(1-k) \qquad (3)$$

showing that in a conventional recirculating delay loop integrator the achievement of a loop gain of 0.999 allows for integrating 1,000 pulses. This limitation in the present art is due to the fact that errors in the recirculating loop have not been corrected. In contrast, the system of the present invention by virtually eliminating error in its delay network is capable of achieving a loop gain which approaches unity to any degree desired in a given application thus having the potential to integrate signals substantially without limit. All that is necessary is to utilize FIG. 1 as a building block to design ultrahigh capacity signal integrating systems.

It is a well known fact that the size, weight, power consumption, and cost of signal equipment is roughly proportional to the bandwidth-duration product implemented for the hardware in the system. In a nonrecirculating signal integrating system which requires the integration of signals having bandwidth B and time duration T, these parameters are proportional to B T. In recirculating signal integrating systems signals having bandwidth B and time duration T can be processed in hardware having bandwidth B and time delay Z. The parameters of size, weight, power consumption, and cost of the system of the present invention are therefore proportional to B Z, i.e., by a fraction Z/T less than conventional non-recirculating signal integrating systems.

As example of a specific application of the system of the present invention consider a linear frequency modulated signal having unit power amplitude, a bandwidth of $B = 10^7$ Hz, and a time duration of $T = 10$ seconds. Using delay lines having time delay $Z = 10^{-7}$ seconds, and frequency shifters having constant frequency shifts $f_s = 0.1$ Hz will result in $10^8$ pulses integrated, i.e., a pulse compression factor of $10^8$. This performance cannot be accomplished in the present art.

Although a particular configuration of a high capacity signal integrating system has been described, it should be understood that the scope of the invention should not be considered to be limited by the particular embodiment of the invention shown by way of illustration but rather by the appendant claims.

What is claimed is:

1. A signal integrating system comprising a recirculating delay loop integrator including a delay network having feedforward error correction and time delay means wherein said network includes:
   a power divider defining a first main signal path and a second reference signal path,
   said first path including a first main amplifier and a first delay line,
   said second path including a second compensating delay line for compensating the delay time of said first amplifier, and a third delay line having a delay time substantially equal to that of said first delay line;
   a differencing network having said first and second paths as inputs and providing an output varying as a function of error introduced in signals in said first path by said first amplifier,
   with an attenuator connected between said first path and said differencing network;
   a second amplifier having the differencing network output as an input; and
   an injection network having said first path and said second amplifier output as inputs and providing an output for recirculation to said power divider,
   with a fourth compensating delay line connected between said first path and said injection network for compensating the delay time of said second amplifier.

2. A system as defined in claim 1 including first and second frequency shifters in said first and second paths, respectively, for shifting the frequency of signals as a function of time.

3. A system as defined in claim 1 wherein said delay network includes frequency shifting means for shifting the frequency of signals as a function of time in a number of recirculations.

4. A method of integrating input signals in a recirculating delay loop integrator having a negative feedback loop with a delay network,
   by correcting for the imperfection of components in the recirculating loop by a feedforward correction and
   delaying the signals integrating them in a number of recirculations in the delay network, including the steps of:
   splitting said signals into first and second slit signals along first and second paths;
   amplifying the first split signal in said first path;
   compensating the amplification delay of the first split signal by compensating delaying the second split signal in said second path;
   delaying the split signals in said first and second paths by equal amounts;
   differencing a portion of the amplified and delayed first signal with the twice delayed second signal to obtain a difference signal representing the error introduced as a result of the imperfection of the amplification and time delay of the first split signal;
   amplifying the difference signal;
   compensating the amplification delay of the amplified difference signal by compensating delaying the first split signal in said first path; and
   comparing the amplified, delayed and twice compensated first signal with the amplified difference signal to obtain a signal for recirculation representing the time delayed first signal substantially free of errors resulting from amplification and time delay.

5. The method of claim 4 including the step of shifting the frequency of the first and second signals by substantially the same amount.

6. The method of claim 4 including the step of shifting the frequency of signals as a function of time in a number of recirculations.

* * * * *